United States Patent
Imura

(10) Patent No.: US 6,507,627 B1
(45) Date of Patent: Jan. 14, 2003

(54) DIRECT CONVERSION RECEIVING APPARATUS WITH DC COMPONENT CUT FUNCTION

(75) Inventor: Minoru Imura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/233,542

(22) Filed: Jan. 20, 1999

(30) Foreign Application Priority Data

Feb. 9, 1998 (JP) ............................................ 10-026851

(51) Int. Cl.[7] .............................................. H04L 27/22
(52) U.S. Cl. ...................................... 375/332; 375/319
(58) Field of Search ................................. 375/319, 329, 375/332, 334, 335, 346, 349, 350; 455/205, 207, 209, 296, 303, 304, 307, 310–313, 317, 318, 324

(56) References Cited

U.S. PATENT DOCUMENTS

| 4,466,134 A | * | 8/1984 | McNicol | ...................... 333/18 |
| 5,339,040 A | | 8/1994 | Loper | |
| 5,584,068 A | * | 12/1996 | Mohindra | .................... 327/558 |
| 5,724,653 A | * | 3/1998 | Baker et al. | ................. 375/319 |
| 5,898,912 A | * | 4/1999 | Heck et al. | ............. 455/226.1 |
| 6,005,896 A | * | 12/1999 | Maruyama | ................... 329/316 |
| 6,035,186 A | * | 3/2000 | Moore et al. | ................ 375/344 |
| 6,112,069 A | * | 8/2000 | Na | ............................. 455/207 |

FOREIGN PATENT DOCUMENTS

| EP | 0 333 266 A2 | 9/1989 |
| EP | 0 364 035 A2 | 4/1990 |
| EP | 0 403 247 A2 | 6/1990 |
| JP | 1-274518 | 11/1989 |
| JP | 3-16349 | 1/1991 |
| JP | 3-220823 | 9/1991 |
| JP | 8-316998 | 11/1996 |
| JP | 9-835983 | 3/1997 |
| JP | 9-261199 | 10/1997 |
| JP | 10-13484 | 1/1998 |

* cited by examiner

Primary Examiner—Chi Pham
Assistant Examiner—Khanh Cong Tran
(74) Attorney, Agent, or Firm—Scully, Scott, Murphy & Presser

(57) ABSTRACT

In a direct conversion receiving apparatus, a first frequency converting section includes a first capacitor, and frequency-converts a high frequency reception signal into a first base band signal using a first local oscillation frequency signal. Then, the; first frequency converting section removes a DC component from the first base band signal using the first capacitor, and converts the first base band signal with the DC component removed into a first digital signal. A second frequency converting section includes a second capacitor, and frequency-converts the high frequency reception signal into a second base band signal using a second local oscillation frequency signal which is different from the first local oscillation frequency signal by 90 degrees in phase. Then, the second frequency converting section removes a DC component from the second base band signal, using the second capacitor, and converts the second base band signal with the DC component removed into a second digital signal. A demodulating section shapes and then demodulates the first and second digital signals to generate a demodulation signal.

19 Claims, 2 Drawing Sheets

DIRECT CONVERSION RECEIVING APPARATUS WITH DC COMPONENT CUT FUNCTION

BACKGROUND OF THE INVENTION

1. Field of the Invention

The present invention relates to a direct conversion receiving apparatus. More particularly, the present invention relates to a direct conversion receiving apparatus in which a reception high frequency signal is converted directly into a base band signal in frequency by a mixer using local oscillation signal frequency.

2. Description of the Related Art

Conventionally, a direct conversion receiving apparatus is known in which a reception high frequency signal is converted directly into a base band signal in frequency by a mixer using a local oscillation signal frequency (Japanese Laid Open Patent Applications (JP-A-Heisei 1-274518, JP-A-Heisei 3-16349,JP-A-Heisei 3-220823).

However, in this direct conversion receiving apparatus, a direct current (DC) off-set voltage is generated at the output of the mixer in addition to the required base band signal due to distortion of even numbered orders of the mixer. Also, when an operational amplifier is used as an amplifier of the base band signal, the DC off-set voltage is amplified by the amplifier. Therefore, in the conventional direct conversion receiving apparatus, reception quality (BER) is deteriorated and the dynamic range of an analog-to-digital converter is remarkably narrowed. Therefore, a method is proposed in which the above-mentioned DC off-set voltage is suppressed by use,of a feedback loop to extract and feed back a DC voltage component (Japanese Laid Open Patent Application (JP-A-Heisei 3-220823)).

In the above-mentioned conventional direct conversion receiving apparatus, circuits such as a duty detecting circuit and a digital-to-analog converter are necessary so that the apparatus has become large in scale on the whole. It is a severe problem especially in a portable phone in which the smallness and lightness of the apparatus are severely demanded. Also, it is a problem from the aspect of power consumption.

SUMMARY OF THE INVENTION

The present invention is accomplished to solve the above mentioned problems. Therefore, an object of the present invention is to provide a direct conversion receiving apparatus in which reception quality can be maintained in a good state without increase of power consumption.

Also, another object of the present invention is to provide a direct conversion receiving apparatus in which influence of a DC off-set voltage can be removed in a relatively small circuit structure.

In order to achieve an aspect of the present invention; a direct conversion receiving apparatus includes a receiving section for receiving a high frequency reception signal. A first frequency converting section includes a first capacitor, and frequency-converts the high frequency reception signal into a first base band signal using a first local oscillation frequency signal. Then, the first frequency converting section removes a DC component from the first base band signal using the first capacitor, and converts the first base band signal with the DC component removed into a first digital signal. A second frequency converting section includes a second capacitor, and frequency-converts the high frequency reception signal into a second base band signal using: a second local oscillation frequency signal which is different from the first local oscillation frequency signal by 90 degrees in phase. Then, the second frequency converting section removes a DC component from the second base band signal using the second capacitor, and converts the second base band signal with the DC component removed into a second digital signal. A demodulating section shapes and then demodulates the first and second digital signals to generate a demodulation signal.

The first frequency converting section includes a first high pass filter composed of the first capacitor, and the second frequency converting section includes a second high pass filter composed of the second capacitor. In this case, a cut-off frequency of each of the first and second high pass filters is lower than a predetermined value.

More specifically, it is preferable that the cut-off frequency of each of the first and second high pass filters is less than about 1% of a symbol rate of QPSK modulation when the high frequency reception signal is subjected to QPSK modulation. Or, it is preferable that the cut-off frequency of each of the first and second high pass filters is less than about 10% of a symbol rate of a frequency spectrum spread modulation, when the high frequency reception signal is subjected to a direct spectrum spread modulation.

Also, the first frequency converting section may include a first analog-to-digital converter, and the first high pass filter is formed from the first capacitor and an input resistance of the first analog-to-digital converter. Also, the second frequency converting section may include a second analog-to-digital converter, and the second high pass filter is formed from the second capacitor and an input resistance of the second analog-to-digital converter. In this case, a capacitance of the first capacitor is desirably set such that the cut-off frequency of the first high-pass filter is lower than the predetermined value, and a capacitance of the second capacitor is set such that the cut-off frequency of the second high-pass filter is lower than the predetermined value. More specifically, a capacitance of each of the first and second capacitors is desirably set based on the input resistance of the corresponding one of the first and second analog-to-digital converters such that the cut-off frequency of each of the first and second high pass filters is less than about 1% of a symbol rate of QPSK modulation when the high frequency reception signal is subjected to QPSK modulation. Or, the capacitance of each of the first and second capacitors is set based on the input resistance of the corresponding one of the first and second analog-to-digital converters such that the cut-off frequency of each of the first and second high pass filters is less than about 10% of a symbol rate of a frequency spectrum spread modulation, when the high frequency reception signal is subjected to a direct spectrum spread modulation.

In the above, each of the first and second frequency converting sections may orthogonally demodulate the high frequency reception signal to which QPSK modulation is performed, and each of the first and second frequency converting sections may orthogonally demodulate the high frequency reception signal to which a direct spectrum spread modulation is performed.

Also, the first frequency converting section may include a phase shifter for shifting the local oscillation frequency signal by 90° in phase, a first mixer for converting the high frequency reception signal in frequency using the phase-shifted local oscillation frequency signal to output the first base band signal, the first capacitor used to: remove a DC component from the first base band signal, and a first analog-to-digital converter for converting the first base band signal with the DC component removed into the first digital signal. Similarly, the second frequency converting section may include a second mixer for converting the high frequency reception signal in frequency using the local oscillation frequency signal to output the second base band signal, the second capacitor used to remove a DC component from the second base band signal, and a second analog-to-digital converter for converting the first base band signal with the DC component removed into the first digital signal.

In order to achieve another aspect of the present invention, a method of generating a demodulation signal in a direct conversion receiving apparatus, includes the steps of:

receiving a high frequency reception signal;

frequency-converting the high frequency reception signal into a first base band signal using a first local oscillation frequency signal;

removing a DC component from the first base band signal;

converting the first base band signal with the DC component removed into a first digital signal;

frequency-converting the high frequency reception signal into a second base band signal using a second local oscillation frequency signal which is different from the first local oscillation frequency signal by 90 degrees in phase;

removing a DC component from the second base band signal;

converting the second base band signal with the DC component removed into a second digital signal; and shaping and then demodulating the first and second digital signals to generate a demodulation signal.

The step of removing a DC component the first base band signal and the step of removing a DC component the second base band signal are performed by first and second high pass filters whose cut-off frequencies are lower than predetermined values. In this case, each of the cut-off frequencies is less than about 1% of a symbol rate of QPSK modulation when the high frequency reception signal is subjected to QPSK modulation. Instead, each of the cut-off frequencies may be less than about 10% of a symbol rate of a frequency spectrum spread modulation, when the high frequency reception signal is subjected to a direct spectrum spread modulation.

Also, the step of converting the first base band signal with the DC component removed into a first digital signal is performed by a first analog-to-digital converter, and the step of removing a DC component from the first base band signal is performed using a first capacitor and an input resistance of the first analog-to-digital converter,. and the step of converting the second base band signal with the DC component removed into a second digital signal is performed by a second analog-to-digital converter, and the step of removing a DC component from the second base band signal is performed using a second capacitor and an input resistance of the second analog-to-digital converter.

DESCRIPTION OF THE PREFERRED EMBODIMENTS

Next, a direct conversion receiving apparatus of the present invention will be described below in detail with reference to the attached drawings.

Figure 1:
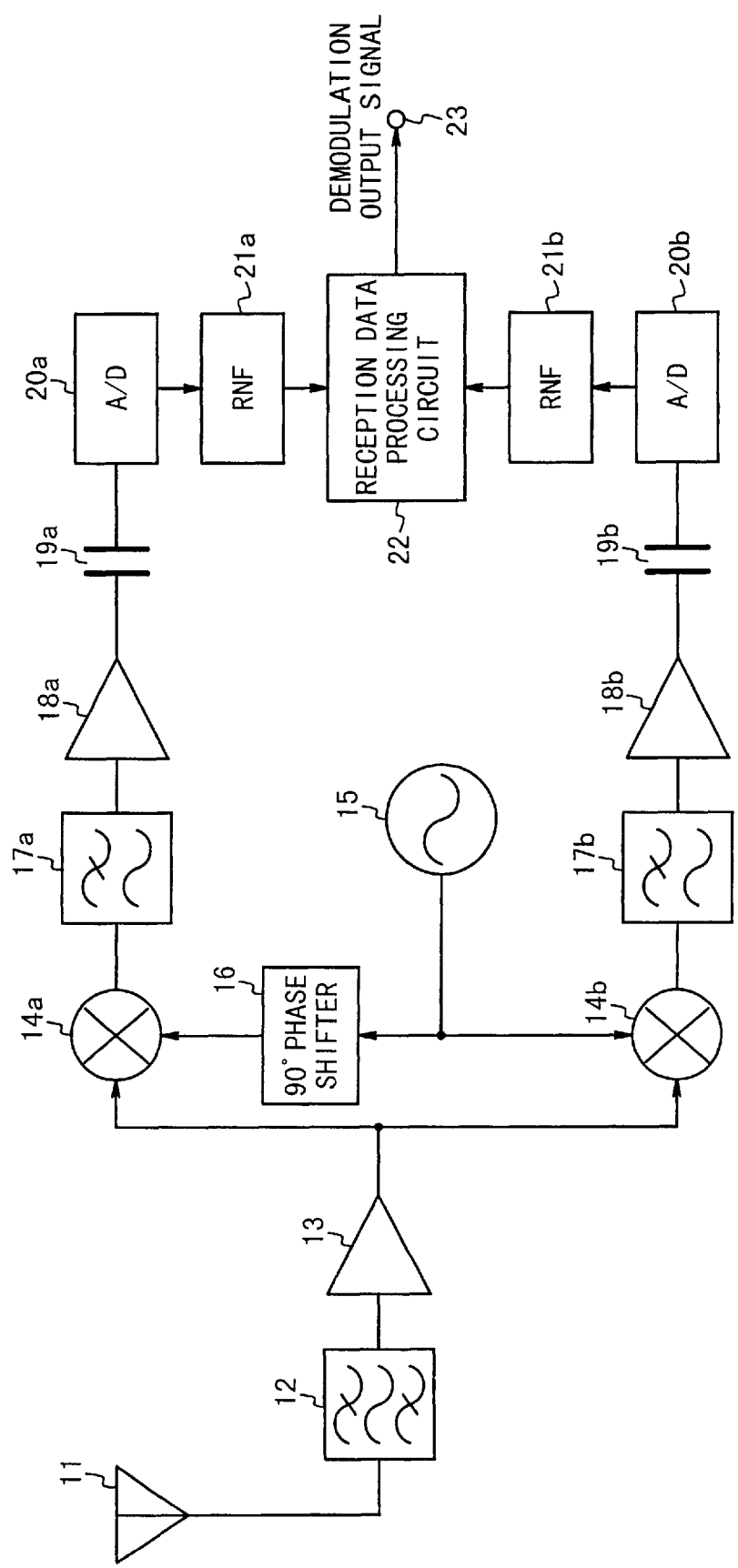
FIG. 1 is a block diagram illustrating a direct conversion receiving apparatus according to an embodiment of the present invention.

FIG. 1 is a:block diagram illustrating the structure of the direct conversion receiving apparatus according to an embodiment of the present invention. This embodiment shows an example of the direct conversion receiving apparatus corresponding to a QPSK modulation system.

The direct conversion receiving apparatus is composed of an antenna 11, a filter 12, an amplifier 13, mixers 14a and 14b, a local oscillator 15, a 90° phase shifter 16, low pass filters 17a and 17b, amplifiers 18a and 18b, capacitors 19a and 19b, analog-to-digital converters 20a and 20b, digital filters 21a and 21b, and a reception data processing circuit 22.

Next, an operation of the direct conversion receiving apparatus according to the embodiment of the present invention will be described below.

A high frequency reception signal is received by an antenna 11. An unnecessary frequency component is removed by the filter 12 from the received high frequency reception signal to prevent degradation of reception quality. The filtered high frequency reception signal is amplified by an amplifier 13 and then branched into 2 components to be respectively supplied to the mixers 14a and 14b.

On the other hand, the local oscillator 15 oscillates to generate a local oscillation frequency signal. The generated local oscillation frequency signal is supplied directly to the mixer 14b and supplied to the 90° phase shifter 16. The 90° phase shifter 16 shifts the local oscillation frequency signal in phase by 90° and then supplies to the mixer 14a.

The mixers 14a and 14b frequency-converts the high frequency reception signal amplified by the amplifier 13 using the local oscillation frequency signal phase-shifted by the 90° phase shifter 16 and the local oscillation frequency signal directly supplied from the local oscillator 15 to produce base band signals (Q signal and I signal), respectively. The base band signals outputted from the mixer 14a and 14b are passed through low pass filters 17a and 17b so as to remove unnecessary frequency components which have been generated in the mixers 14a and 14b, respectively. The filtered base band signals are supplied to amplifiers 18a and 18b and amplified to amplitudes corresponding to the full scale of analog-to-digital converters 20a and 20b of the following stage. The amplified base band signals are supplied to the analog-to-digital converters 20a and 20b through the capacitors 19a and 19b, respectively.

Digital signals obtained by performing analog-digital conversion to the supplied base band signals by the analog-to-digital converters 20a and 20b are supplied to digital filters 21a and 21b. The digital filters 21a and 21b are, for example, are route Nyquist filters (RNF). The digital filters 21a and 21b are provided to prevent interference between symbols and to perform waveform shaping. Then, the digital signals are supplied to the reception data processing circuit 22. A demodulating process is performed to the digital signals and a demodulation signal is outputted from an output terminal 23.

In this case, in the general direct conversion receiving apparatus, the DC off-set voltage is generated due to distortions of even numbered orders generated in the mixers 14a and 14b. Also, when operational amplifiers 18a and 18b are used to amplify the base band signals, the DC off-set voltages are amplified. Thus, the DC off-set voltage is further increased. Therefore, thinking of amplitude spectrum of the single base band rectangle signal, the unnecessary DC off-set voltage is added to a low frequency component which is contained in the base band signal.

Therefore, in this embodiment, the DC component is removed using the capacitors 19a and 19b. Thus, the influence of the unnecessary DC off-set voltage is removed. However, if the capacitors 19a and 19b are simply used, the DC component and low frequency component which are originally contained in the base band signal component are also removed at the same time. In addition, the impulse responses of the digital filters 21a and 21b designed to prevent interference between the symbols are disturbed.

Figure 2:
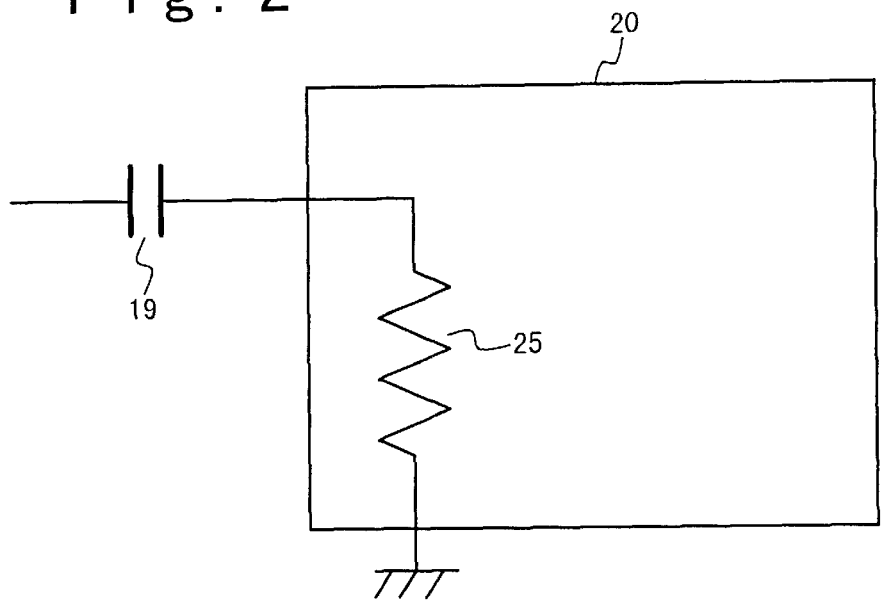
FIG. 2 is a diagram illustrating a capacitance and an analog-to-digital converter in the embodiment of the present invention.

Therefore, it is necessary that the capacitances of the above-mentioned capacitors 19a and 19b are determined, considering the input impedances such as input resistances of the analog-to-digital-converters 20a and 20b of the following stage. In other words, as shown in FIG. 2, a high-pass filter is formed from a capacitor 19, which corresponds to the capacitor 19a or 19b of FIG. 1, and the input resistance 25 of the analog-to-digital converter 20, which corresponds to the analog-to-digital converter 20a or 20b of FIG. 1. Therefore, the cut-off frequency of this high-pass filter must be appropriately selected in accordance with the symbol rate to be used in the QPSK modulation. If not so, there is a possibility to make remarkable reception quality (BER) degradation occur.

Figure 3:
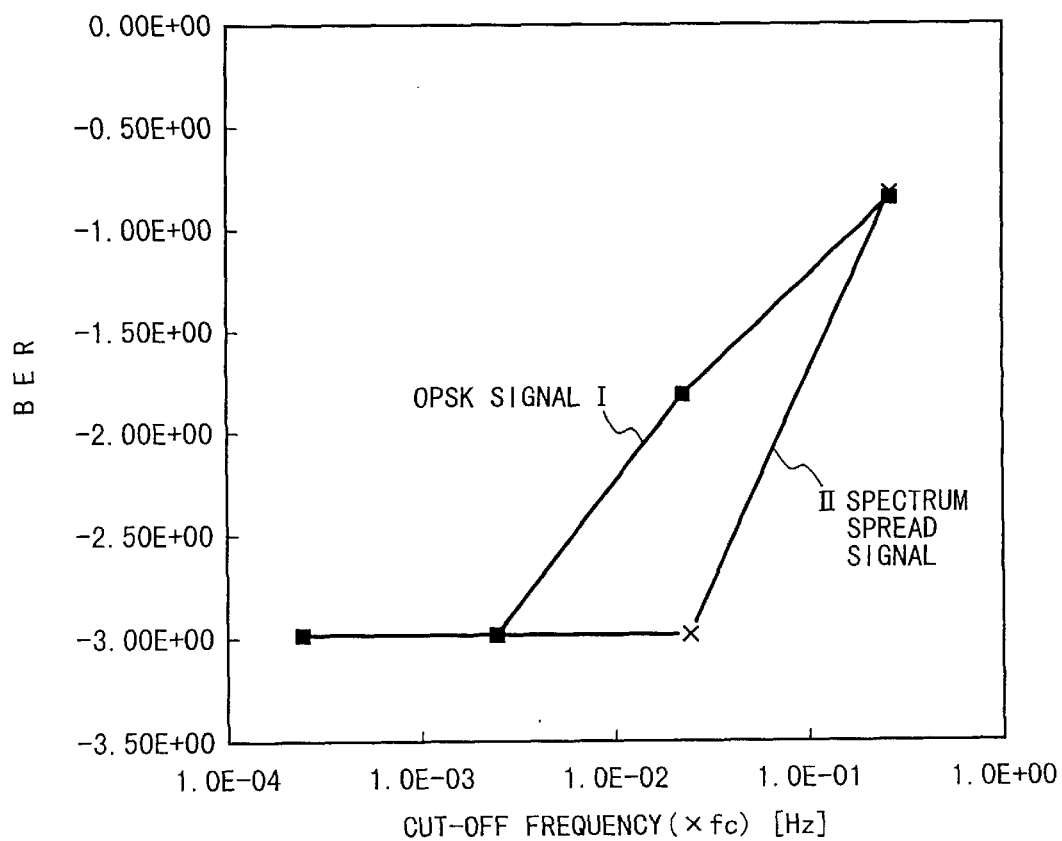
FIG. 3 is a diagram shows relation of cut-off frequency of a high-pass filter and reception quality (BER), when the present invention is applied to a QPSK modulation signal (I) and a spectrum spread modulation signal (II).

Therefore, in this embodiment, the capacitances of the above-mentioned capacitors 19a and 19b are set in such a manner that the cut-off frequencies of the high-pass filters composed of the capacitors 19a and 19b and the input resistances of the analog-to-digital converters 20a and 20b are lower than about 1% of the symbol rate in the QPSK modulation. Thus, as show in FIG. 3 by I, the influence of the DC off-set voltage can be removed without degradation of the reception quality (BER). It should be noted that an example of the symbol rate of the QPSK modulation is 21k symbol per a second, or 192k symbol per a second, for example.

Also, in this embodiment, the influence of the DC off-set voltage is removed using the capacitors 19a and 19b as passive components. Therefore, it is possible to decrease power consumption and to make the apparatus small and light, compared with the circuit such as an off-set canceller in which power consumption is large.

It should be noted that the present invention is not limited to the above-mentioned embodiment. For example, the present invention can be applied to the reception apparatus in the spectrum spread communication. In this case, the capacitances of the above-mentioned capacitors 19a and 19b are set in such a manner that the cut-off frequencies of the high-pass filters composed of the capacitors 19a and 19b and the input resistances of the analog-to-digital converters 20a and 20b are lower than about 10% of the symbol rate of the spectrum spread communication in the direct spreading (DS) system of the spreading ratio of 64. Thus, as show in FIG. 3 by II, the influence of the DC off-set voltage can be removed without degradation of the reception quality (BER).

As described above, according to the present invention, the cut-off frequency of the high-pass filter composed of the DC component removing capacitor and the input resistance of the analog-to-digital converter is set to be lower than a predetermined value. Therefore, it is possible to prevent the low frequency component which is, originally contained in the base band signal from being removed. Thus, the DC off-set voltage of the base band signal outputted from the frequency converting section can be removed by the DC component removing capacitor without degradation of the reception quality (BER).

Also, according to the present invention, the DC off-set voltage of the base band signal is removed by the DC component removing capacitor which is a passive component. Therefore, compared with the conventional reception apparatus in which a DC off-set voltage is removed by an off-set canceller, the power consumption can be greatly reduced and the circuit structure can be simplified. Therefore, the present invention is suitable for application to a portable phone.

What is claimed is:

1. A direct conversion receiving apparatus comprising:
    a receiving section for receiving a high frequency reception signal;
    a first frequency converting section including a first capacitor, for frequency-converting said high frequency reception signal into a first base band signal using a first local oscillation frequency signal, for removing a DC component from said first base band signal using said first capacitor, and for converting said first base band signal with the DC component removed into a first digital signal;
    a second frequency converting section including a second capacitor, for frequency-converting said high frequency reception signal into a second base band signal using a second local oscillation frequency signal which is different from said first local oscillation frequency signal by 90 degrees in phase, for removing a DC component from said second base band signal using said second capacitor, and for converting said second base band signal with the DC component removed into a second digital signal; and
    a demodulating section for shaping and then demodulating said first and second digital signals to generate a demodulation signal;
        wherein said first frequency converting section includes a first high pass filter composed of said first capacitor, and said second frequency converting section includes a second high pass filter composed of said second capacitor.

2. A direct conversion receiving apparatus according to claim 1, wherein a cut-off frequency of each of said first and second high pass filters is lower than a predetermined value.

3. A direct conversion receiving apparatus according to claim 2, wherein the cut-off frequency of each of said first and second high pass filters is less than about 1% of a symbol rate of QPSK modulation when said high frequency reception signal is subjected to QPSK modulation.

4. A direct conversion receiving apparatus according to claim 2, wherein the cut-off frequency of each of said first and second high pass filters is less than about 10% of a symbol rate of a frequency spectrum spread modulation, when said high frequency reception signal is subjected to a direct spectrum spread modulation.

5. A direct conversion receiving apparatus according to claim 2, wherein said first frequency converting section includes a first analog-to-digital converter, and said first high pass filter is formed from said first capacitor and an input resistance of said first analog-to-digital converter, and wherein said second frequency converting section includes a second analog-to-digital converter, and said second high pass filter is formed from said second capacitor and an input resistance of said second analog-to-digital converter.

6. A direct conversion receiving apparatus according to claim 5, wherein a capacitance of said first capacitor is set such that the cut-off frequency of said first high-pass filter is lower than said predetermined value, and a capacitance of said second capacitor is set such that the cut-off frequency of said second high-pass filter is lower than said predetermined value.

7. A direct conversion receiving apparatus according to claim 6, wherein a capacitance of each of said first and second capacitors is set based on the input resistance of the corresponding one of said first and second analog-to-digital converters such that the cut-off frequency of each of said first and second high pass filters is less than about 1% of a symbol rate of QPSK modulation when said high frequency reception signal is subjected to QPSK modulation.

8. A direct conversion receiving apparatus according to claim 6, wherein a capacitance of each of said first and second capacitors is set based on the input resistance of the corresponding one of said first and second analog-to-digital converters such that the cut-off frequency of each of said first and second high pass filters is less than about 10% of a symbol rate of a frequency spectrum spread modulation, when said high frequency reception signal is subjected to a direct spectrum spread modulation.

9. A direct conversion receiving apparatus according to claim 1, wherein each of said first and second frequency converting sections orthogonally demodulates said high frequency reception signal to which QPSK modulation is performed.

10. A direct conversion receiving apparatus according to claim 1, wherein each of said first and second frequency converting sections orthogonally demodulates said high frequency reception signal to which a direct spectrum spread modulation is performed.

11. A direct conversion receiving apparatus comprising:
a receiving section for receiving a high frequency reception signal;
a first frequency converting section including a first capacitor, for frequency-converting said high frequency reception signal into a first base band signal using a first local oscillation frequency signal, for removing a DC component from said first base band signal using said first capacitor, and for converting said first base band signal with the DC component removed into a first digital signal;
a second frequency converting section including a second capacitor, for frequency-converting said high frequency reception signal into a second base band signal using a second local oscillation frequency signal which is different from said first local oscillation frequency signal by 90 degrees in phase, for removing a DC component from said second base band signal using said second capacitor, and for converting said second base band signal with the DC component removed into a second digital signal; and
a demodulating section for shaping and then demodulating said first and second digital signals to generate a demodulation signal;
wherein said first frequency converting section includes:
a phase shifter for shifting said local oscillation frequency signal by 90° in phase;
a first mixer for converting said high frequency reception signal in frequency using said phase-shifted local oscillation frequency signal to output said first base band signal;
said first capacitor forming part of a first high pass filter used to remove a DC component from said first base band signal; and
a first analog-to-digital converter for converting said first base band signal with the DC component removed into said first digital signal, and
wherein said second frequency converting section includes:
a second mixer for converting said high frequency reception signal in frequency using said local oscillation frequency signal to output said second base band signal;
said second capacitor forming part of a first high pass filter used to remove a DC component from said second base band signal; and
a second analog-to-digital converter for converting said fist base band signal with the DC component removed into said first digital signal.

12. A method of generating a demodulation signal in a direct conversion receiving apparatus, comprising the steps of:
receiving a high frequency reception signal;
frequency-converting said high frequency reception signal into a first base band signal using a first local oscillation frequency signal;
removing a DC component from said first base band signal;
converting said first base hand signal with the DC component removed into a first digital signal;
frequency-converting said high frequency reception signal into a second base band signal using a second local oscillation frequency signal which is different from said first local oscillation frequency signal by 90 degrees in phase;
removing a DC component from said second base band signal;
converting said second base band signal with the DC component removed into a second digital signal; and
shaping and then demodulating said first and second digital signals to generate a demodulation signal;
wherein said step of removing a DC component said first base band signal and said step of removing a DC component said second base band signal are performed by first and second high pass filters whose cut-off frequencies are lower than predetermined values.

13. A method according to claim 12, wherein each of the cut-off frequencies is less than about 1% of a symbol rate of QPSK modulation when said high frequency reception signal is subjected to QPSK modulation.

14. A method according to claim 12, wherein each of the cut-off frequencies is less than about 10% of a symbol rate of a frequency spectrum spread modulation, when said high frequency reception signal is subjected to a direct spectrum spread modulation.

15. A method of generating a demodulation signal in a direct conversion receiving apparatus, comprising the steps of:
receiving a high frequency reception signal;
frequency-converting said high frequency reception signal into a first base band signal using a first local oscillation frequency signal;

removing a DC component from said first base band signal;

converting said first base band signal with the DC component removed into a first digital signal;

frequency-converting said high frequency reception signal into a second base band signal using a second local oscillation frequency signal which is different from said first local oscillation frequency signal by 90 degrees in phase;

removing a DC component from said second base band signal;

converting said second base band signal with the DC component removed into a second digital signal; and shaping and then demodulating said first and second digital signals to generate a demodulation signal;

wherein said step of converting said first base band signal with the DC component removed into a first digital signal is performed by a first analog-to-digital converter, and said step of removing a DC component from said first base band signal is performed using a first capacitor and an input resistance of said first analog-to-digital converter, and wherein said step of converting said second base band signal with the DC component removed into a second digital signal is performed by a second analog-to-digital converter, and said step of removing a DC component from said second base band signal is performed using a second capacitor and an input resistance of said second analog-to-digital converter.

16. A method according to claim 15, wherein a capacitance of each of said first and second capacitors is set based on the input resistance of the corresponding one of said first and second analog-to-digital converters such that the cut-off frequency of each of said first and second high pass filters is less than about 1% of a symbol rate of QPSK modulation when said high frequency reception signal is subjected to QPSK modulation.

17. A method according to claim 15, wherein a capacitance of each of said first and second capacitors is set based on the input resistance of the corresponding one of said first and second analog-to-digital converters such that the cut-off frequency of each of said first and second high pass filters is less than about 10% of a symbol rate of a frequency spectrum spread modulation, when said high frequency reception signal is subjected to a direct spectrum spread modulation.

18. A method according to claim 12, wherein each of said first and second frequency converting sections orthogonally demodulates said high frequency reception signal to which QPSK modulation is performed.

19. A method according to claim 12, wherein each of said first and second frequency converting sections orthogonally demodulates said high frequency reception signal to which a direct spectrum spread modulation is performed.

* * * * *